United States Patent

Yihong et al.

[11] Patent Number: 6,118,684
[45] Date of Patent: Sep. 12, 2000

[54] OPTICAL MEMORIES USING ELECTRON TRAPPING MATERIAL

[76] Inventors: Wu Yihong, Block 2B4, Tampines Street 22, #09-151, Singapore 520284; Chong Tow Chong, 6 Jalan Rendang, Singapore 428344, both of Singapore; Beh Chee Yang, 71 Jalan Sentosa, Bukit Mertajam, Penang 14000, Malaysia

[21] Appl. No.: 09/032,269

[22] Filed: Feb. 27, 1998

[30] Foreign Application Priority Data

Oct. 3, 1997 [SG] Singapore ............................ 9703649-5

[51] Int. Cl.[7] .................................................. G11C 13/00
[52] U.S. Cl. ............................................ 365/106; 365/215
[58] Field of Search ................................ 365/106, 64, 215

[56] References Cited

U.S. PATENT DOCUMENTS 3,658,584  4/1972  Schmidt .................................. 117/201
4,864,536  9/1989  Lindmayer .............................. 365/106
5,502,706  3/1996  Yang et al. ............................. 365/106

*Primary Examiner*—Trong Phan
*Assistant Examiner*—M. Tran
*Attorney, Agent, or Firm*—Fish & Richardson P.C.

[57] ABSTRACT

A three-dimensional memory based on the electron trapping materials, comprising at least two thin film layers of different or the same electron trapping materials for storing information in the form of the trapped charges and releasing information in the form of light energy, each of the thin film layers of the electron trapping materials being sandwiched between a pair of transparent electrodes. The thin film layer itself is a multiple layer of one or more than two types of electron trapping materials in which the impurity atoms are modulation doped with predetermined modulation profiles. The page-by-page addressing is achieved by applying a suitable voltage to the information to be addressed. Separate control of writing and reading processes is made possible by varying the voltage polarity.

7 Claims, 7 Drawing Sheets

FIG.3
(PRIOR ART)

○ HOST ATOM

+ Eu

* Sm

RANDOM DOPING

FIG.4

MODULATION DOPING

FILTER FUNCTION

APPROXIMATE BEAM PROFILE

OPTICAL MEMORIES USING ELECTRON TRAPPING MATERIAL

FIELD OF INVENTION

This invention relates to optical memories using modulation electron trapping materials. In one aspect, the invention is particularly suitable for implementing a three-dimensional optical memory.

BACKGROUND ART

Mass memories are indispensable for storing and distributing information in the multimedia industry. The basic requirements for mass storage media and the corresponding recording and retrieving systems are 1) large capacity, 2) fast access, and 3) low cost. All these three requirements, in particular 1) and 3), are largely determined by the storage density i.e., the ability to store and recall large amounts of data in the smallest possible area or space. In most existing optical memories data are stored two-dimensionally (2D) across a planar surface with each bit of information occupying an area of a diameter approximately equal to the lateral size of the writing or reading laser spot; thus the only way to increase the recording density to reduce the spot size. Due to the diffraction nature of light, the smallest spot size that can be achieved by conventional optics is limited by the laser wavelength. To break this physical limit, several techniques are being investigated both theoretically and experimentally in the laboratory level, such as super-resolution and near-field optical recording. In either case, however, the data are still stored two-dimensionally; one will sooner or later face the physical limit problem again.

To overcome the restrictions imposed by present two-dimensional memories, various three-dimensional optical memories have been proposed. Among them are memories comprising a plurality of substrates separated by a light transmissive medium, two-photon memories, electron trapping memories, and holographic memories, for example. Since the information is stored in volume, three-dimensional optical memories have higher theoretical storage density than their planar counterparts. In addition, if the data can be arranged into two-dimensional pages and an entire two-dimensional page can be written or read in a single memory access operation, one can expect a very high data transfer bit rate and fast access.

For these three-dimensional optical memories, however, the maximum number of pages that can be stored is very dependent on the writing and reading techniques. In particular, for those which are based in the detection of intensity variation of reflected light, the maximum number of pages is generally low because each information layer requires a certain level of reflectivity in order to moderate reproduced signal level and modulation depth. Furthermore, crosstalk between adjacent layers is also inevitable unless the interlayer spacing is much larger than the depth of focus of the laser spot; this puts another limitation to the maximum number of pages that can be stored on a disk with a given thickness.

Holographic memory is, in principle, a true three-dimensional storage device. However, its performance at the present stage is limited by the lack of suitable materials. One of the distinguishing features of holographic storage is that both the amplitude and phase information of every single bit of original data are stored across the entire storage medium. Its page wise addressing capability allows very fast access speed and an extremely high data transfer rate. Although holographic memory may be viable in the future if suitable materials can be found, it is not a practical option.

In all these amplitude and/or phase-based techniques, the information layer basically can be considered as a spatial light modulator which modulates the laser beam either in the intensity, phase or polarisation. The information layer itself does not generate any photons or luminescence during the reproduction process. At present, the only method that is based on the detection of luminescence from the information layer is the so called electron trapping memory. Since each information layer is not required to have a certain level of reflectivity, this technique naturally allows storing large amounts of data three-dimensionally provided that a reliable page-by-page method can be found to address each information layer. To this end, the inventors have proposed in U.S. Pat. No. 5,502,706 a three-dimensional optical memory, comprising at least two thin film layers of different electron trapping materials for storing and releasing information in the form of light energy, in which each of the thin film layers of electron trapping material is sandwiched between a pair of insulating layers and a pair of transparent electrodes. By using such a structure, the page wise accessing is achieved through selectively supplying a voltage to the transparent electrodes to enhance either the storage or releasing of information to or from the addressed thin film layer.

A further explanation of this technique is given below with referring to FIGS. 1 and 2 which are reproduced from U.S. Pat. No. 5,502,706. The mechanism for information storage in electron trapping materials is firstly illustrated in FIG. 1. The most widely used host materials are wide bandgap alkaline earth compounds (e.g., SrS). The addition of rare earth atoms (e.g., Eu/Sm) into these compounds creates new energy levels associated with each atom within the forbidden band of the host materials. Taking SrS:Eu/Sm system as an example, during the write process short wavelength light excites electrons from the ground state of Eu to the corresponding excited state. The excited electron can either recombine to generate luminescence or hop to and be finally trapped by the Sm atoms. Since the electrons can remain in the ground state of Sm for a very long time, information is thus stored in these deep traps within the electron's lifetime. To reproduce the information, light with a longer wavelength is irradiated to the thin film to excite the electrons from the ground state of Sm atoms to the corresponding excited states; these re-excited electrons will transfer back to the excited states of Eu and finally return to the ground states of Eu through emission of photons. In this way, electron trapping materials can be used to store information in the form of trapped electrons; the information can be reproduced by detecting the number of photons emitted by the information layer. Further explanation of electron trapping is given in P. Goldsmith, J. Lindmayer, and C. Y. Wrigley, "Electron trapping: a new approach to rewriteable optical data storage", Proc. SPIE Vol. 1316, Optical Data Storage, 1990, pp. 312–320.

The charge transfer between the Eu and Sm atoms mentioned above is a very complicated quantum mechanical process and therefore the transfer efficiency is determined by many factors. To achieve a truly page wise addressable three-dimensional memory, one must find a means to control the transfer efficiency of each information layer separately from other adjacent layers. By utilising the phenomenon of electric field induced ionisation, the inventors of U.S. Pat. No. 5,502,706 have proposed a crosstalk reduction method of three-dimensional memory based on selective supply of voltage to the information layer to be addressed. The physics behind this technique shown in FIG. 2. The principle is that, if the host material is highly resistive and the inter-atom spacing is sufficiently large, then the only way to make the transfer possible from Eu to Sm or vice versa is to bring the electrons to the conduction band by the application of an external electric field, and then let them drift or diffuse to other impurity sites so that they can be recaptured.

The above mentioned approach, however, has disadvantages: (i) in order to reduce the transfer efficiency at zero electric field, the impurity spacing must be large, and the concentration will generally be 10 times lower than that used for two-dimensional memory as in the above examples; this significantly reduces the dynamic range of the readout signals; (ii) depending on the depth of the deep levels, to bring the electrons from the deep levels to the conduction band requires a very large electric field which is undesirable for practical application systems; (iii) the efficiency enhancement achieved as described in U.S. Pat. No. 5,502,706 is typically only about 1%, meaning that in practical terms the page selectivity is very low.

SUMMARY OF THE INVENTION

The present invention has been devised bearing in mind the above problems.

In one aspect, the invention provides an optical memory comprising electron trapping material comprising impurity atoms in a substantially non-random spatial distribution. Preferably, the memory comprises at least one electrode for applying an electric field to the electron trapping material; in a preferred form first and second electrodes are provide one on each side of the electron trapping material.

During the work leading to the present invention, it was appreciated that some of the disadvantages of the prior art can be attributed to the random distribution of the impurity atoms, for example, in the system described in U.S. Pat. No. 5,502,706. For example:

(i) With a random distribution of impurity atoms, the spacing between adjacent pairs of impurities will vary widely. For example, a typical random distribution is illustrated in FIG. 3. A fixed value of electric field may not be able to completely erase all information pits of an information layer. The unerased pits will thus form a source of noise for subsequently written information, and thereby place severe restrictions on the dynamic range. However, by using a non-random distribution, the spacing between impurity pairs can be controlled, leading to more complete erasure of information and improved dynamic range.

(ii) With a random distribution of impurity atoms, an electron transferred from one Sm atom to an Eu atom during recording might be recaptured by another Sm atom due to the strong electric field, or vice versa. This will adversely affect the read, write and erase efficiency. However, by using a non-random distribution, such random effects can be controlled and, to a large extent, minimised.

In a preferred form, the impurity atoms form a layered structure within the electron trapping material. More preferably, the impurity atoms are arranged generally as spaced apart layers. The layers may be spaced either by the same host material for the impurities, or by a different material, for example, having a larger bandgap. The spacing between the layers is preferably such that charge transfer between the layers is negligible when there is no external applied field, but large enough for writing and reading information when a predetermined electric field is applied.

In a particularly preferred form (illustrated schematically in FIG. 4), the impurities are spatially located within a very narrow region of the information layer (ie. the trapping material). Such a distribution of each impurity corresponds to a delta profile. Due to the delta-shape of the doping profile, the distance between the nearest pair of, for example, Eu and Sm impurities can be almost constant over the whole information layer. This makes it possible to write, read and erase information with high efficiency at a single value of external voltage. The writing and reading processes can easily be switched simply by varying the polarity of the voltage applied to the electrodes.

In another aspect, the invention provides a three dimensional optical memory comprising first and second information layers and electrodes sandwiching the layers for selecting a layer to be accessed by the application of an electric field, wherein each information layer comprises electron trapping material with impurity atoms in a generally non-random distribution.

In another aspect, the invention provides a three-dimensional memory based on the electron trapping materials with a novel modulation doped structure. The three-dimensional memory in accordance with this aspect comprises at least two thin layers of different or the same electron trapping materials for storing and releasing information in the form of light energy in which each of the thin film layers of the electron trapping materials is sandwiched between a pair of transparent electrodes. The novel feature of this aspect is that said thin film layer itself is a multiple layer of one or more then two types of electron trapping materials in which the impurity atoms are modulation doped with predetermined modulation profiles.

The electron trapping material is preferably an alkaline-earth compound doped with rare-earth impurities. The respective impurity atoms for storing and releasing information are spatially separated either by the host material or by a different type of material with a larger bandgap. The spacing between two different types of impurities is predetermined so that the charge transfer between the two elements is negligible when there is no external field applied but large enough for writing and reading information when a voltage is applied cross the information layer through the two electrodes. To increase the efficiency of writing and reading, the most desirable doping profile might have a planar shape in which the impurities are spatially located within a very narrow region of the information layer.

BASIC DESCRIPTION OF THE DRAWINGS

The invention, and a preferred embodiment thereof, is further described, by way of example only, with reference to the accompanying drawings, in which:

FIG. 3 depicts schematically the random doping profile of electron trapping materials according to the prior art;

FIG. 4 depicts a preferred modulation doped profile of electron trapping materials in a preferred embodiment of the invention;

Figure 6:
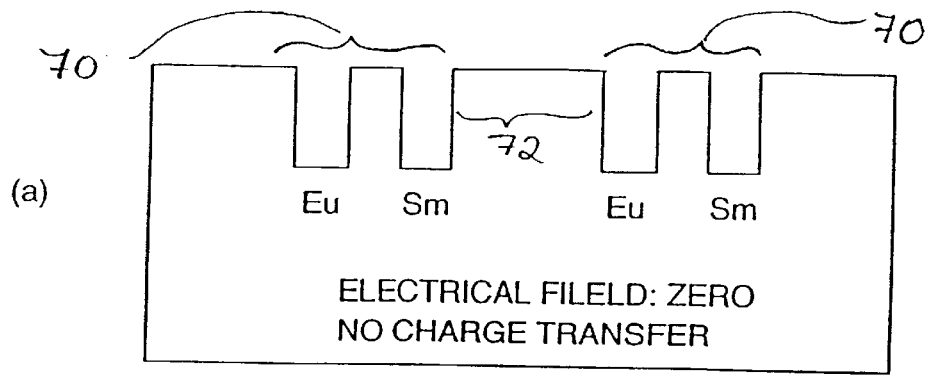
Figure 6:
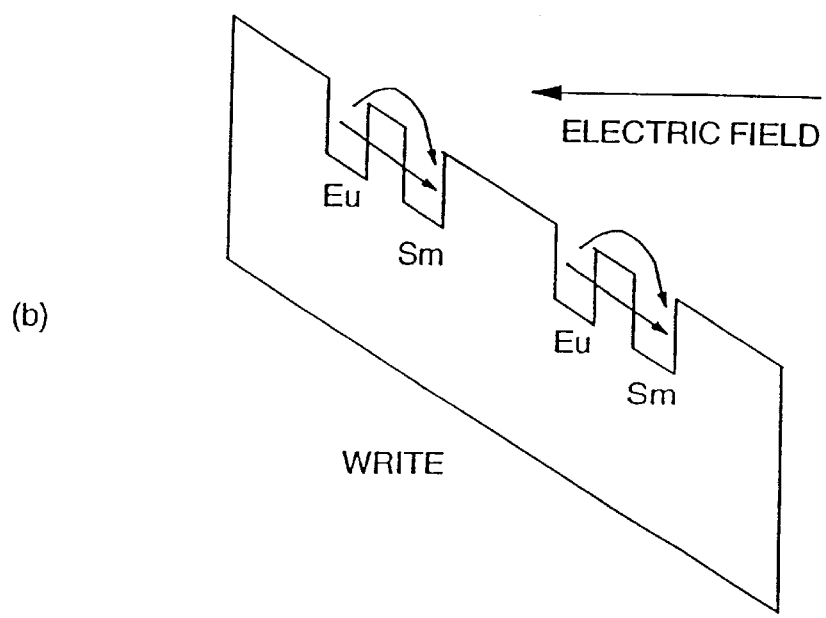
Figure 6:
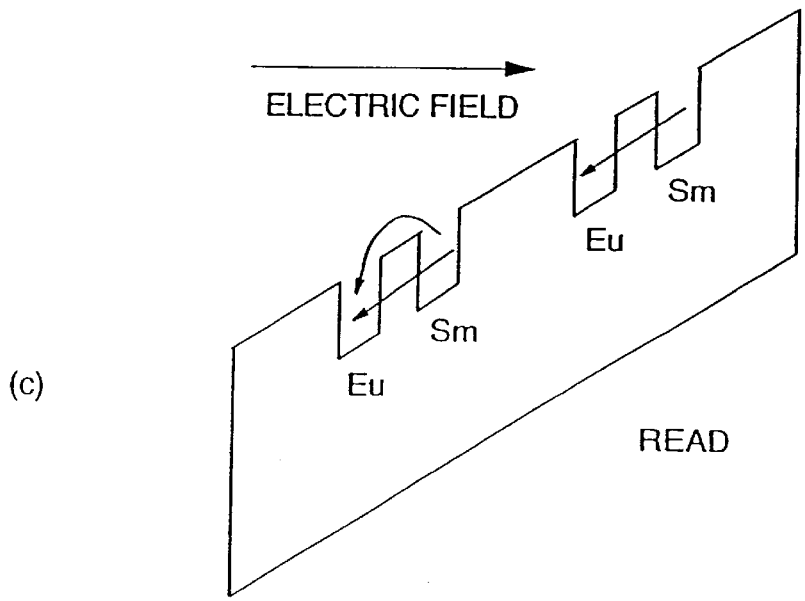
Figure 7:
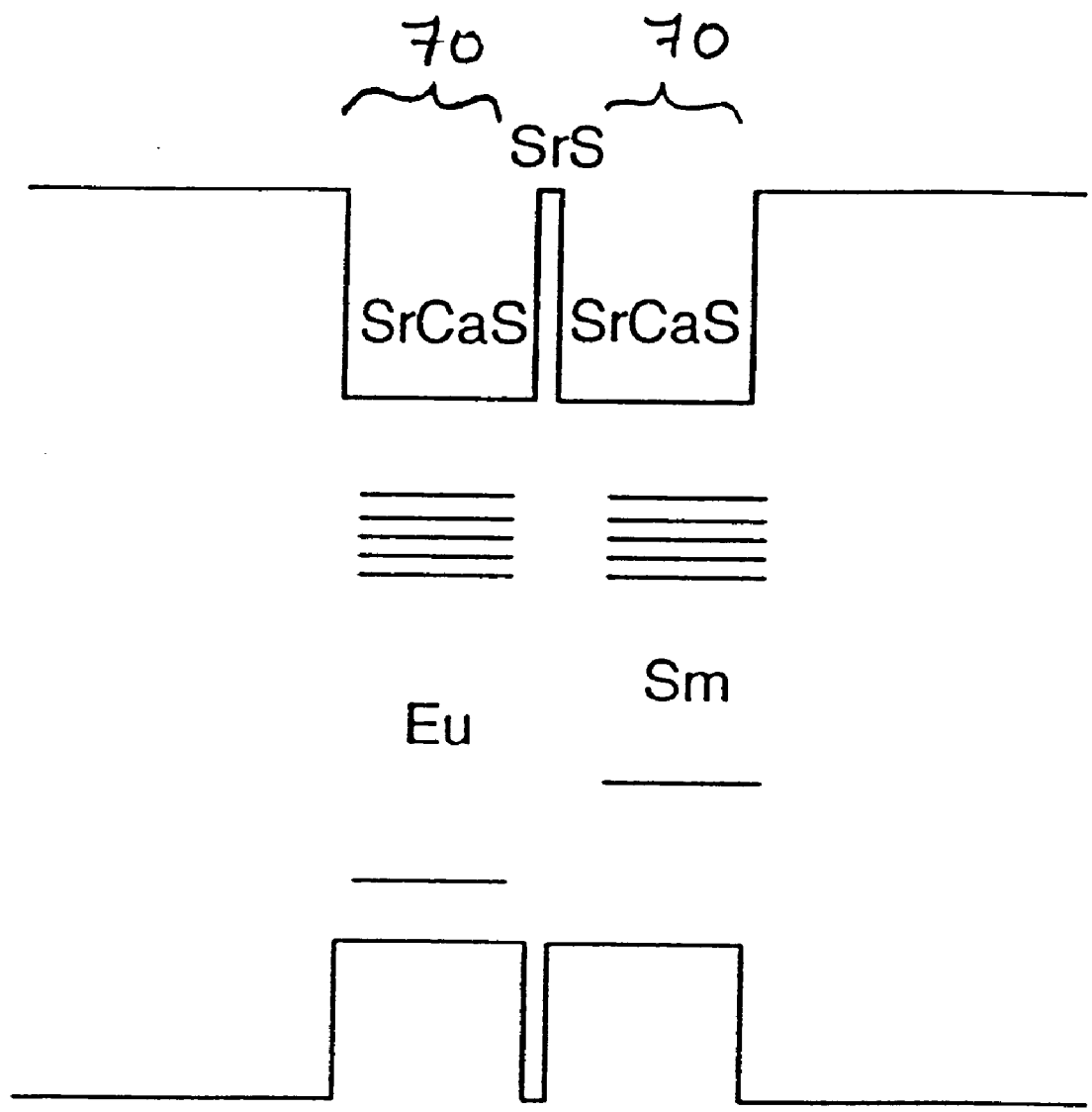
Figure 8:
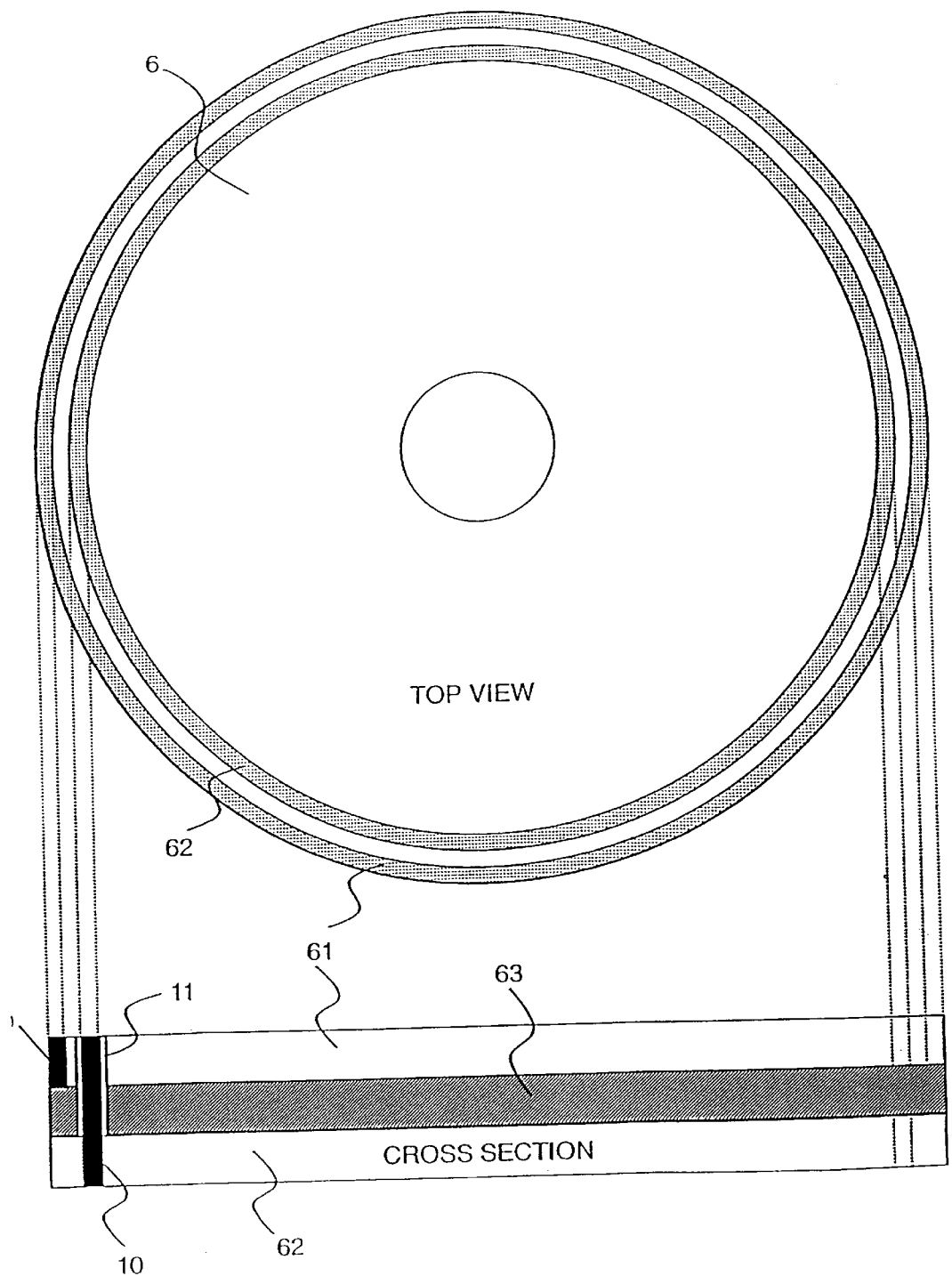

FIG. 6 explains the principle of bi-directionally controlled charge transfer between information storage (Eu) and releasing atoms (Sm) by an external electric field;

FIG. 7 is a schematic band structures of an alternative layer;

FIG. 8 illustrates schematically electrode structures useable to supply voltages to each information layer.

Figure 9:
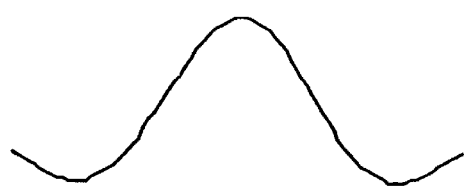
Figure 9:
Figure 9:
Figure 9:
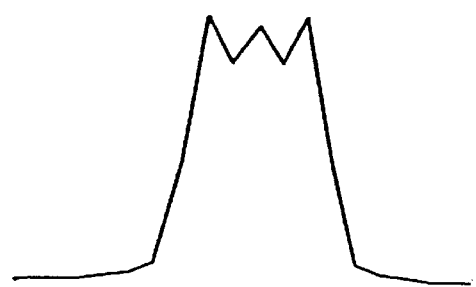
Figure 9:
Figure 9:
Figure 9:
Figure 9:
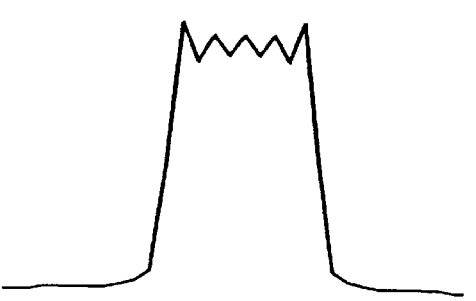

FIG. 9 shows possible filter functions and the corresponding intensity profiles of read laser beam on the information layer.

DESCRIPTION OF THE PREFERRED EMBODIMENT

Figure 1:
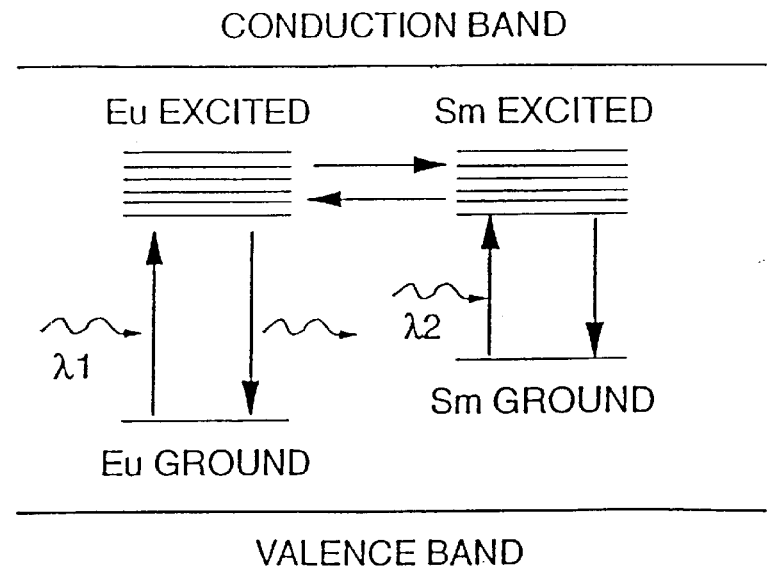
FIG. 1 illustrates the principle of optical memory based on electron trapping materials—SrS: Eu/Sm.
Figure 2:
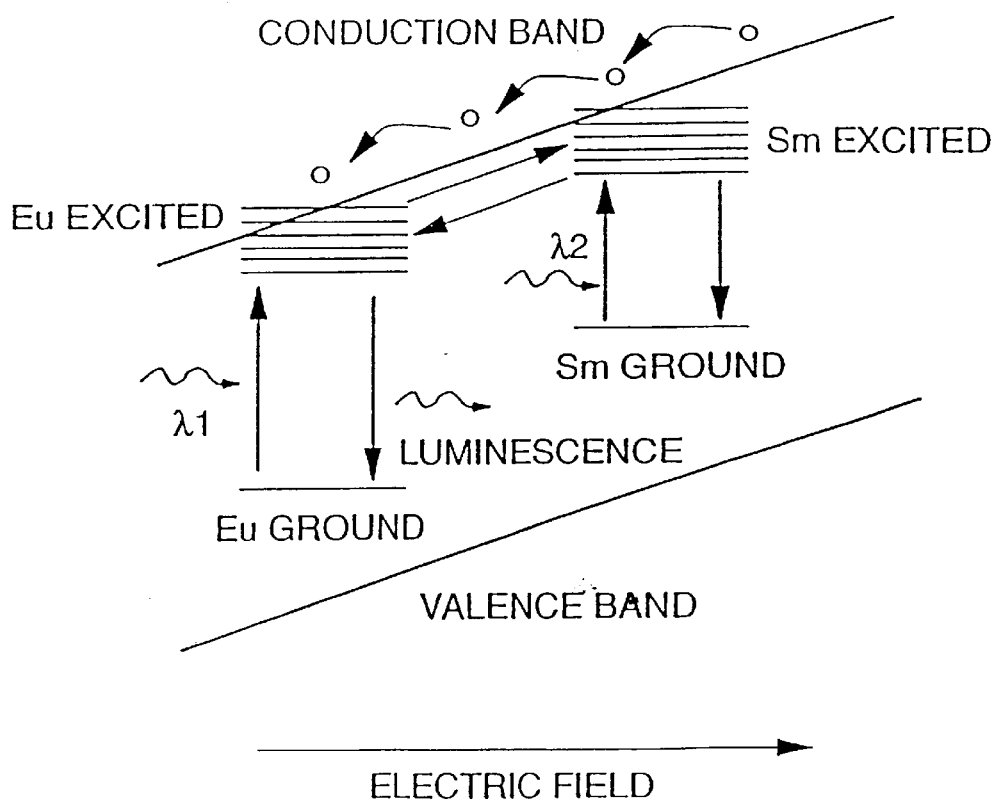
FIG. 2 depicts schematically the transfer efficiency enhancement mechanism by applying an external electric field.
Figure 5:
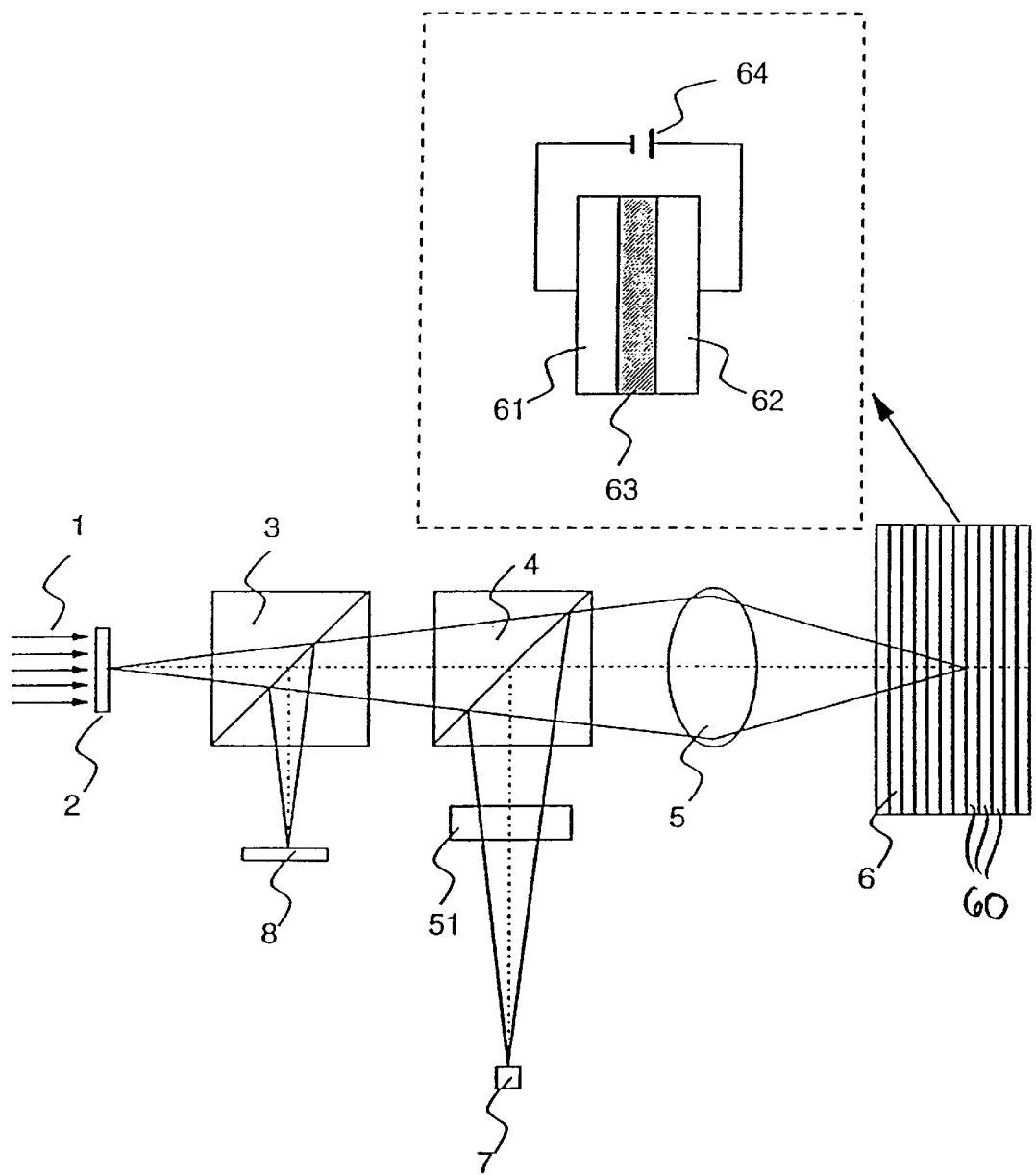
FIG. 5 illustrates schematically an optical system for reading and writing information to a three-dimensional memory.

Referring to FIGS. 5 and 8, a three dimensional optical memory consists of a multi layer arrangement of information pages 60 stacked one in front of another. Each information page consists of a layer of electron trapping material 63 arranged between two transparent electrodes 61 and 62 for applying an electric field across the electron trapping material. To this extent, the structure is as described in U.S. Pat. No. 5,502,706, to which the reader is referred for more detail. The electrodes are coupled to an electronic control circuit which is operable to selectively apply a voltage (depicted schematically at 64) to the electrodes to address the page for reading or for writing. In this embodiment, although each page has its own front and rear electrodes, it will be appreciated that the same electrode could constitute the rear electrode of one layer, and the front electrode of an adjacent layer. The memory may be generally circular (cylindrical) as shown in FIG. 8, or it may be any desired shape.

Referring to FIG. 5, the information to be recorded is first arranged into two-dimensional matrixes of pixels (pages) of which the intensity for each pixel represents one bit information. To record the information into the memory 6, a two-dimensional data input device 2 is illuminated by a writing laser beam 1, and is imaged to the addressed information layer by an adjustable focusing lens 5. Page addressing is achieve by applying a suitable voltage 64 to the information layer to be addressed 63 through the two transparent electrodes 61 and 62. To reproduce the data from the memory 6, a read light beam 7 is focused onto the information layer to be addressed 63 by the same objective lens 5 through a dichromatic beamspliter 4. Page addressing is achieved again by applying suitable voltage 64 to the information layer 63 to be addressed.

The intensity distribution profile of the read laser beam on the information layer 63 can be adjusted by a spatial filter 51. Some preferred filter functions and the corresponding approximate intensity profiles are illustrated in FIG. 9. Since the information is detected as intensity variation of luminescences, it is of importance to have a read beam of uniform intensity distribution. Therefore, the filter of the last row of FIG. 9 may be most desirable. In order to read data from a large area optical memory using a single readout operation, additional beam shaping optics might be added to the read arm of FIG. 5 so as to make the spot size larger than the diffraction limited size of the objective lens 5. Alternatively one can also use a laser diode array instead of a single light source so that a uniformly distributed larger laser spots can be obtained on the information layer during readout.

The resultant emission from the addressed information layer corresponding to the data stored is collected by the objective lens 5 and finally imaged to and detected by a two-dimensional detector 8 through a beamsplitter 3. To read information stored in either layers one just need to move the objective lens 5 to focus the laser beam on the desired layer and at the same time supply a voltage with suitable polarity to the selected layer.

An important feature of the present invention resides in using a predetermined, or non-random, impurity distribution in the information layer electron trapping material. In the present embodiment, the impurities are modulation doped as shown in FIG. 4. The information storage and releasing atoms are confined separately into two or more very narrow planar regions inside the material. The spacing between the two different types of atoms are predetermined such that charge transfer between the two different types of atoms is negligible under zero external electric field.

FIG. 6 illustrates the basic principle of writing and reading operations by using SrS as the host material and Eu and Sm as the information releasing and storage atoms, respectively. FIG. 6a illustrates the situation when no electric field is present; as explained above the spacing between the impurities is such that there is negligible charge transfer. FIG. 6b illustrates the application of an electric field of a suitable magnitude in a first direction to encourage charge transfer from Eu impurity atoms to Sm impurity atoms i.e. for a write or recording operation. FIG. 6c illustrates the application of the electric field in the reverse direction, to encourage charge transfer from Sm atoms to Eu atoms, i.e. for a read operation. Therefore, the charge transfer from one type of atom to the other can either be enhanced or further suppressed depending on the polarity of external voltage. This direction control is a consequence of the predetermined distribution of the impurity atoms, so that the impurity pairs will be orientated generally uniformly and will therefore behave similarly when an electric field is applied. Therefore, not only the page addressing but also the writing and reading processes can be controlled separately by electric means.

A plurality of pairs of Eu and Sm planes 70 can be provided to increase the dynamic range of the storage medium, instead of having only a single plane of each impurity type. The spacing 72 between each adjacent pairs of Eu and Sm is preferably chosen thick enough so that even there exists an external electric field the charge transfer between adjacent pairs is still very small.

To further reduce crosstalk, a quantum well structure can be used, for example, to separate an impurity pair of one plane 70 from an impurity pair of an adjacent plane 70, to prevent the transferred electrons overflowing to a next sheet of atoms. FIG. 7 illustrates one such sort of structure SrS as the barrier layer and SrCaS as the well layer in which the Eu and Sm atoms are modulation doped.

The electron trapping materials can be fabricated by any type of thin film deposition techniques such as vacuum evaporation, sputtering, chemical vapour phase deposition, molecular beam epitaxy, etc. The modulation doping can be easily achieved through alternate supply of source materials for the host and dopants. The electrode can be an indium tin oxide layer or any other conductive materials which are transparent to both the writing and reading laser beams. The contacts to the electrodes of each layer can be obtained by using electrically isolated through holes, as shown schematically in FIG. 8 in which 9 and 10 are contact holes and 11 is the isolation layer.

In order to reduce the reflection loss at each interface the total thickness of each unit of storage medium, comprising the electrodes and information storage layer, is chosen such that the round-trip optical path difference is an integer number of the wavelength of the writing laser beam. To minimise the reflection also for the reading laser beam, one can choose a light source with a double wavelength of the writing light beam.

Although the apparatus of the preferred embodiment is capable of both writing and reading information on the optical memory, it will be appreciated that, in other embodiments, the apparatus might only be capable of read-only or write-only operation; in that case, the optical and electronic systems may be simplified.

It will be appreciated that the non-random modulation doping of the impurities in accordance with the invention, particularly as illustrated in the preferred embodiment, can provide many features that the randomly doped structures can not achieve. Among them the most distinguished features are high efficiency and almost perfect selectivity. These features make the three-dimensional memory based on trapping materials more attractive than other multi-layer reflective-based memories.

What is claimed is:

1. An optical memory comprising election trapping material comprising impurity atoms in a substantially non-random spatial distribution, wherein the impurity atoms of the first type are spaced from the impurity atoms of the second type such that charge transfer between the two types is substantially negligible when no external field is applied, but is large enough for reading and/or for writing when an external electric field is applied.

2. An optical memory comprising electron trapping material comprising impurity atoms in a substantially non-random spatial distribution, wherein at least some impurity atoms of the first type are separated from at least some impurity atoms of the second type by a material having a larger band gap than the host material.

3. An optical memory comprising electron trapping material comprising impurity atoms in a substantially non-random spatial distribution, a through hole, and means for making an electrically insulated connection to at least one of the electrodes through the through hole.

4. An optical memory recording and/or reading system comprising, a three-dimensional multi-page optical memory, electrical means for addressing pages of the memory, an optical input and/or output means, wherein the optical memory comprises first and second information layers and electrodes sandwiching the layers for selecting a layer to be accessed by the application of an electric field, wherein each information layer comprises electron trapping material with impurity atoms in a generally non-random distribution, and a laser diode array for generating a compound read beam for illuminating the optical memory.

5. An optical memory recording and/or reading system comprising, a three-dimensional multi-page optical memory, electrical means for addressing pages of the memory, and optical input and/or output means, wherein the optical memory comprises first and second information layers and electrodes sandwiching the layers for selecting a layer to be accessed by the application of an electric field, wherein each information layer comprises electron trapping material with impurity atoms in a generally non-random distribution, wherein the electrical means is operable to apply a voltage of a first polarity to select a page for read access, and to apply a voltage of opposite polarity to select a page for write access.

6. An optical memory recording and/or reading system comprising a three-dimensional multi-page optical memory, electrical means for addressing pages of the memory, and optical input and/or output means, wherein the optical memory comprises first and second information layers and electrodes sandwiching the layers for selecting a layer to be accessed by the application of an electric field, wherein each information layer comprises electron trapping material with impurity atoms in a generally non-random distribution, wherein the thickness of each unit of storage medium is such that the round-trip optical path difference is an integer number of wavelengths of the writing light, and of the reading light.

7. An optical recording and reading system for recording information on, and for reading information from, a multi-page three-dimensional optical memory, the system comprising optical means for inputting and outputting information, and electrical means for applying a voltage to address in information page in the optical memory, the electrical means being operable to apply a voltage of a first polarity to select a page for read access, and a voltage of an opposite polarity to select a page for write access.

* * * * *